US006862705B1

(12) United States Patent  
Nesbitt et al.

(10) Patent No.: US 6,862,705 B1  
(45) Date of Patent: Mar. 1, 2005

(54) SYSTEM AND METHOD FOR TESTING HIGH PIN COUNT ELECTRONIC DEVICES USING A TEST BOARD WITH TEST CHANNELS

(75) Inventors: Richard T. Nesbitt, San Diego, CA (US); Jim Icuss, San Diego, CA (US); Hong Dai, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 344 days.

(21) Appl. No.: 10/224,894

(22) Filed: Aug. 21, 2002

(51) Int. Cl.[7] ............................................. G01R 31/28
(52) U.S. Cl. ...................................................... 714/729
(58) Field of Search ................................ 714/726, 727, 714/728, 729, 724, 30

(56) References Cited

U.S. PATENT DOCUMENTS

| | | | |
|---|---|---|---|
| 4,989,209 A | 1/1991 | Littlebury et al. | |
| 5,115,191 A | 5/1992 | Yoshimori | |
| 5,260,947 A * | 11/1993 | Posse | 714/727 |
| 5,513,188 A * | 4/1996 | Parker et al. | 714/727 |
| 5,640,404 A | 6/1997 | Satish | |
| 5,787,098 A | 7/1998 | DasGupta et al. | |
| 5,909,452 A * | 6/1999 | Angelotti | 714/726 |
| 6,071,314 A | 6/2000 | Baxter et al. | |
| 6,442,721 B2 * | 8/2002 | Whetsel | 714/726 |

* cited by examiner

*Primary Examiner*—Christine T. Tu
(74) *Attorney, Agent, or Firm*—Incaplaw; Terrance A. Meador

(57) ABSTRACT

An automated test system for testing electrical device I/O pad continuity includes a load board upon which the device under test ("DUT") is mounted. The number of I/O pins on the DUT exceeds the number of direct testing channels available on the load board. The excess number of I/O pins are connected to boundary scan cells of one or more boundary scan devices. The boundary scan devices receive one or more test data input patterns and test control signals via connection points on the load board. The boundary scan devices, which are complaint with JTAG boundary scan testing standards, are utilized to indirectly test the electrical continuity from the I/O pads of the DUT to the external pins or solder balls of the DUT.

21 Claims, 5 Drawing Sheets

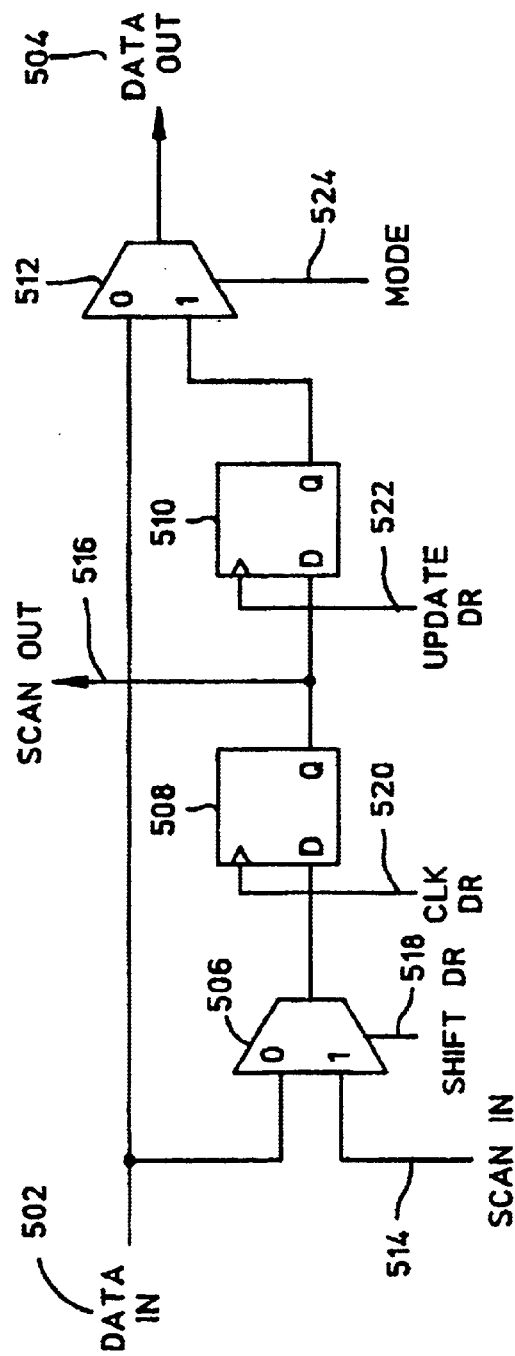
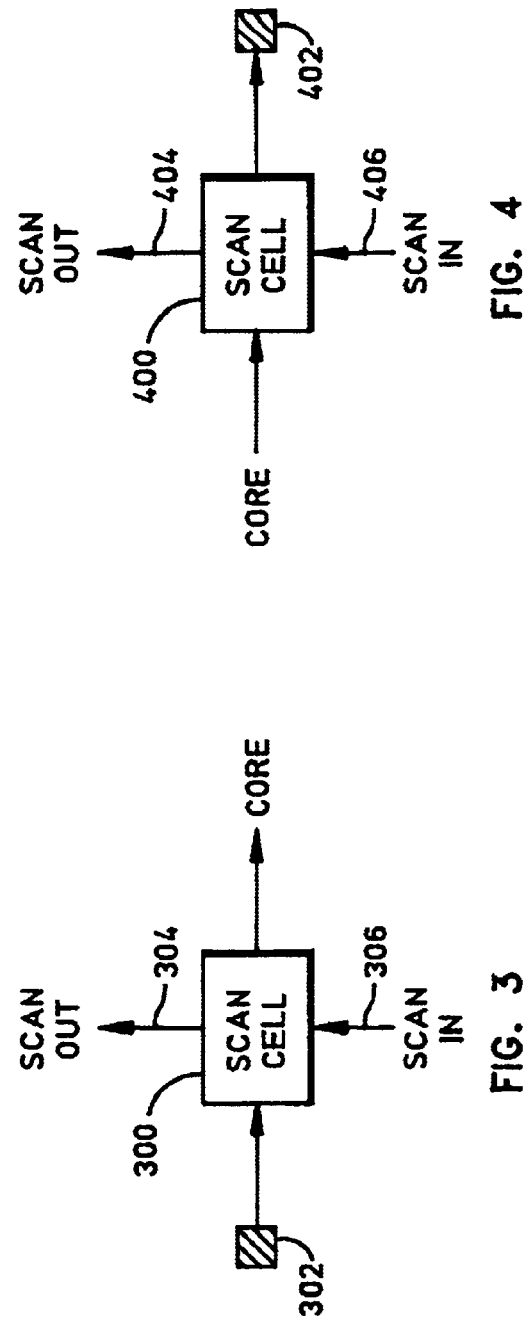
FIG. 5 — PRIOR ART
FIG. 4
FIG. 3

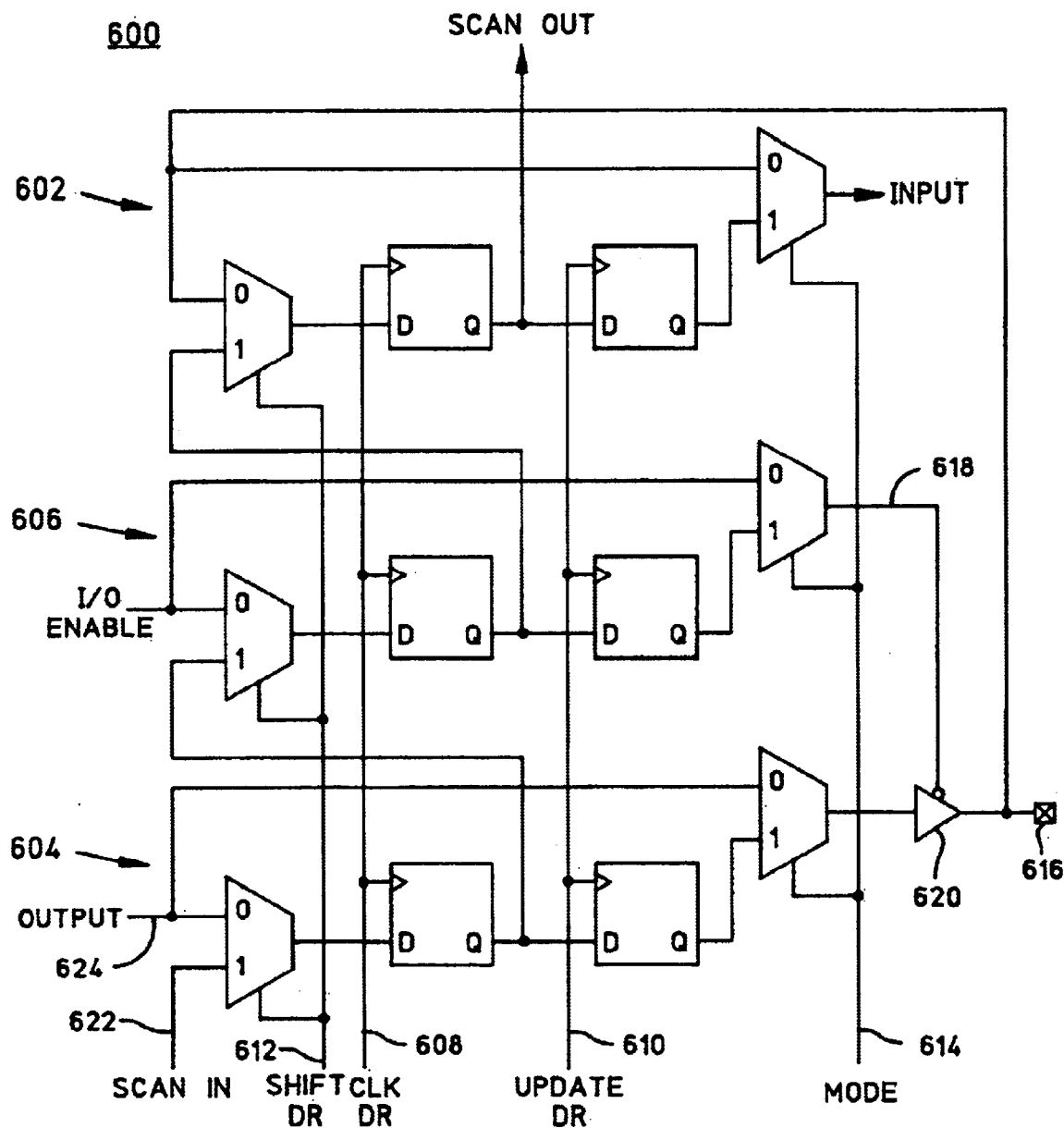
FIG. 6 — PRIOR ART

SYSTEM AND METHOD FOR TESTING HIGH PIN COUNT ELECTRONIC DEVICES USING A TEST BOARD WITH TEST CHANNELS

FIELD OF THE INVENTION

The present invention relates generally to automated electronic device test equipment. More particularly, the present invention relates to an automated testing technique for high pin count electronic devices.

BACKGROUND OF THE INVENTION

Complex integrated circuits ("ICs") typically include a very large number of input and output ("I/O") pins. For example, practical electronic devices may include hundreds and even thousands of I/O pins. Conventional testing of an IC having a high number of I/O pins is best accomplished with a test fixture having at least the same number of test channels (otherwise, only a portion of the IC I/O pins can be directly tested at any given time). A test fixture or board having hundreds or thousands of I/O channels, however, can be very expensive to manufacture. Furthermore, although a test fixture or board having a very large number of I/O channels may be suitable for use with a current generation of IC devices, it may quickly become obsolete (or inefficient) as newer, higher pin count devices are developed and manufactured. Accordingly, a need exists for an automated test system and technique for testing high pin count ICs with an "older generation" test fixture, where the number of I/O test channels in the test fixture is less than the number of I/O pins on the IC.

BRIEF SUMMARY OF THE INVENTION

The present invention provides an IC test fixture and corresponding testing procedure that can be used to test ICs having very high I/O pin counts. The test fixture may utilize an older generation IC test board having a number of I/O test channels, where the number of I/O pins on the device under test exceeds the number of available I/O test channels. A practical embodiment of the test fixture leverages JTAG boundary scan techniques, as set forth in IEEE Standard 1149.1.

The above and other aspects of the present invention may be carried out in one form by an electronic device testing apparatus having: a device receptacle configured to receive a device under test (DUT), the device receptacle comprising a plurality of electrical connections corresponding to input/output pins of the DUT; a boundary scan device comprising a number of input/output pads; and a number of conductive links, each being connected between one of the input/output pads and one of the electrical connections. The boundary scan device is configured to test electrical continuity of the DUT.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

FIG. 3 is a schematic representation of a boundary scan cell corresponding to an input pad;

FIG. 4 is a schematic representation of a boundary scan cell corresponding to an output pad;

FIG. 5 is a circuit diagram of a universal boundary scan cell;

FIG. 6 is a circuit diagram of a bi-directional boundary scan cell; and

DETAILED DESCRIPTION OF A PREFERRED EMBODIMENT

Figure 1:
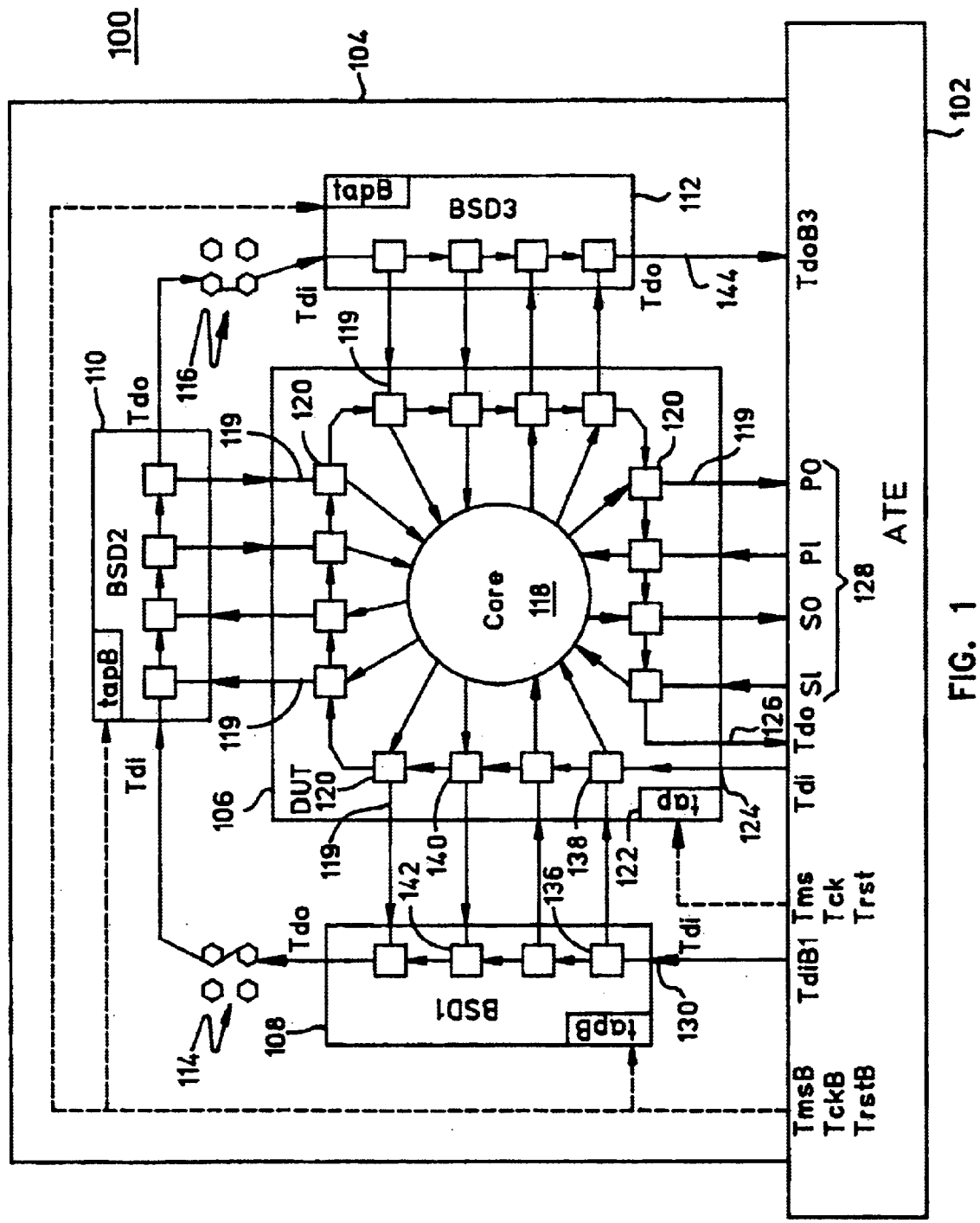
FIG. 1 is a schematic representation of an electronic device testing system that incorporates the techniques of the present invention.

The present invention may be described herein in terms of functional block components and various processing steps. It should be appreciated that such functional blocks may be realized by any number of hardware components configured to perform the specified functions. For example, the present invention may employ various integrated circuit components, e.g., memory elements, digital signal processing elements, logic elements, look-up tables, and the like, which may carry out a variety of functions under the control of one or more microprocessors or other control devices. In addition, those skilled in the art will appreciate that the present invention may be practiced in conjunction with the testing of any number (and different types) of electronic devices and that the example system described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional techniques related to automatic test equipment control, JTAG boundary scan cell design and control, test pattern design, the analysis of test results, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

Complex ICs may include hundreds and thousands of I/O pins (or other connection elements), and the number of I/O pins in practical circuits may continue to increase as IC manufacturing technologies develop. Ideally, the automated test equipment used to test such ICs includes at least the same number of test channels as the number of I/O pins in the device under test ("DUT"). For example, a load board for use in automated test equipment may include a DUT socket receptacle having 256 connection points corresponding to 256 distinct test channels. Such a load board is compatible with ICs having up to 256 I/O pins (assuming that the DUT is mounted to a suitably configured socket that matches the receptacle on the load board). An IC having more than 256 I/O pins cannot be directly tested using such a load board.

To facilitate testing, many ICs now incorporate the JTAG boundary scan architecture set forth in "IEEE Standard Test Access Port and Boundary-Scan Architecture" (IEEE Standard 1149.1-1990, Institute of Electrical and Electronic Engineers, Inc., 1993). The content of this document is incorporated by reference herein. An IC testing technique according to the present invention leverages the JTAG boundary scan architecture in the DUT to test the electrical continuity from the internal I/O pads on the DUT die to the I/O pins of the DUT package. The boundary scan techniques can be utilized to test an IC having a large number of I/O pins with an "older generation" load board designed for compatibility with automated test equipment having a limited number of test channels. For example, using the techniques described herein, a load board having only 256 test channels (directly compatible with automated test equipment having 256 test channels) can be employed to test an IC having more than 256 I/O pins.

FIG. 1 is a schematic representation of an electronic device testing system 100 that incorporates the techniques of the present invention. System 100 generally includes automated test equipment ("ATE") 102 and a load board 104 coupled to ATE 102. Load board 104 is suitably configured to receive a DUT 106, as shown in FIG. 1. In a practical embodiment, load board 104 includes a DUT socket receptacle (not shown) that receives a DUT socket (not shown) upon which DUT 106 is mounted. The DUT socket may be designed to accommodate a specific DUT package (e.g., a ball grid array package). The DUT socket is suitably designed to provide a conductive interface between DUT 106 and the DUT socket receptacle on the load board. Accordingly, the DUT socket includes a plurality of electrical connections corresponding to I/O pins (or connection points) of DUT 106. For purposes of this example, DUT 106 includes sixteen I/O pads, and ATE 102 includes eighteen channels (only four of which are utilized as direct I/O testing channels). In a practical embodiment, DUT 106 can have any number of I/O pads (typically in the hundreds or thousands), and ATE 102 can include any number of I/O test channels (e.g., 256). The example embodiments described herein illustrate the inventive concepts and are not intended to limit or restrict the scope of the invention in any way.

System 100 preferably includes one or more boundary scan devices ("BSDs") coupled to load board 104. The following description and claims may refer to a BSD or a combination of two or more BSDs as a "boundary scan arrangement." The illustrated example includes a first BSD 108, a second BSD 110, and a third BSD 112. In a practical embodiment, each BSD is mounted to a conductive socket which, in turn, is mounted to load board 104. Alternatively, the BSDs can be directly mounted to load board 104. Load board 104 may also include a number of selection elements (e.g., switches, jumpers, connectors, or the like) that allow system 100 to operate in different modes (described below). In this regard, the example embodiment includes a first switch assembly 114 and a second switch assembly 116 that function as selection elements. To ensure that the testing of DUT 106 is valid, the boundary scan capability of each BSD must be intact and properly functioning. The BSDs allow system 100 to check the electrical continuity from the I/O pads on the DUT die to the package pins on the DUT, and the electrical continuity from the package pins to the conductive connections on load board 104. In this manner, structural and manufacturing faults (e.g., shorts, opens, defective wire bonds, I/O signals stuck at zero or one, shorts between I/O pins) can be detected.

In system 100, load board 104 is set such that the BSDs are connected in series with one another. In other words, the test data output ("TDO") node of first BSD 108 is coupled to the test data input ("TDI") node of second BSD 110, and the TDO node of second BSD 110 is coupled to the TDI node of third BSD 112. Thus, a test pattern input at the TDI node of first BSD 108 is cycled through the boundary scan cells of BSDs 108/110/112 before appearing at the TDO node of third BSD 112. As shown in FIG. 1, switch assemblies 114/116 are configured to establish the serial connection between the BSDs. This arrangement facilitates single scan chain testing and is desirable when the number of ATE test channels is limited.

Figure 2:
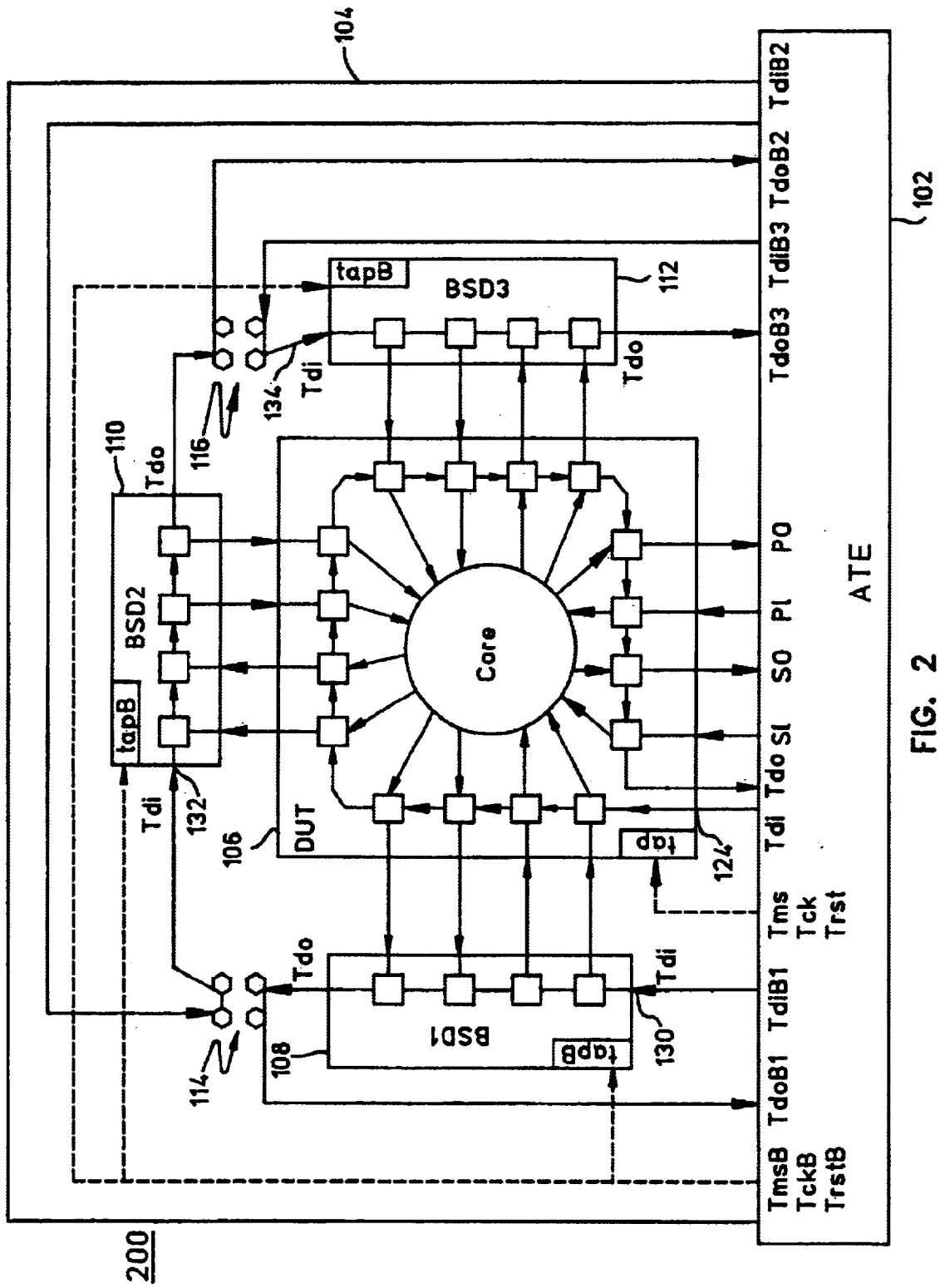
FIG. 2 is a schematic representation of an alternately configured electronic device testing system.

FIG. 2 depicts an alternate embodiment (designated as system 200) where load board 104 is set such that each BSD 108/110/112 has a separate and distinct input port and a separate and distinct output port. For example, first BSD 108 receives a first test pattern at its TDI node (represented by "TDIB1") and generates an output test pattern at its TDO node (represented by "TDOB1"). Second BSD 110 and third BSD 112 are similarly configured to receive and generate different patterns. As shown in FIG. 2, switch assemblies 114/116 are suitably configured to accommodate the various TDI and TDO signals. Assuming that ATE 102 has a sufficient number of available test channels, system 200 can be utilized to reduce the test time of DUT 106.

In accordance with one practical embodiment, each BSD 108/110/112 is a field programmable gate array ("FPGA") device having JTAG boundary scan capabilities. In other words, each of the I/O pins of the FPGA has a corresponding boundary scan cell. For purposes of the present invention, the core functionality of the BSDs is irrelevant; testing system 100 merely leverages the boundary scan capabilities of the BSDs. Thus, system 100 can utilize any electronic device that supports the JTAG boundary scan architecture for BSDs. FPGAs are desirable for use in system 100 due to their low cost and because they are available in high pin counts. In accordance with one practical embodiment, system 100 utilizes FPGAs available from Altera Corporation for each BSD 108/110/112.

ATE 102 may employ known diagnostic methodologies and conventional techniques to perform a variety of tests on a DUT 106. In this regard, ATE 102 is configured to establish a number of electrical connections with load board 104 (represented in FIG. 1 and FIG. 2 by the various signals and arrows at the junction between ATE 102 and load board 104). For example, ATE 102 may provide a number of clock signals to DUT 106, supply operating power to DUT 106, provide a number of test signals (e.g., digital test patterns or vectors) as inputs to DUT 106 and/or to the BSDs, receive output signals from DUT 106 and/or from the BSDs, provide test control signals to DUT 106 and/or to the BSDs, etc. In practice, the interface between load board 104 and ATE 102 includes a fixed number of test channels. Consequently, although the internal configuration of load board 104 and the manner in which ATE 102 generates test signals and interprets test results can be redesigned to accommodate a specific DUT, the physical interface with ATE 102 remains consistent.

DUT 106, which can be configured in accordance with known technologies and manufacturing techniques, includes an internal logic core 118 and a plurality of die-level I/O pads 119. The specific functionality of core 118 is unimportant for purposes of this description. Indeed, the techniques of the present invention focus on electrical continuity testing of the I/O features of DUT 106 rather than the functional testing of core 118. Depending upon the functionality of core 118, a given I/O pad 119 may be an input pad or an output pad. Accordingly, core 118 is depicted with a number of outgoing arrows representing outputs and a number of incoming arrows representing inputs. In the illustrated embodiment, DUT 106 includes sixteen I/O pads 119. I/O pads 119 are formed at the die level of DUT 106; although not shown in FIG. 1, DUT 106 includes a conductive path from each I/O pad 119 to a pin, solder ball, or other conductive connection point located on the DUT package.

For example, in a typical BGA package, an I/O pad 119 is connected to a flip-chip solder ball, which is connected to a conductive pad on a BGA substrate, which is connected to an interconnect structure formed in the BGA substrate, which is connected to a BGA solder ball that serves as a DUT package connection point.

System 100 includes a number of conductive links (represented by the arrows between the BSDs and DUT 106) connected between the I/O pads of the BSDs and the respective I/O pins of DUT 106. In practice, these conductive links are formed on load board 104 such that electrical connection points (e.g., BGA balls) on the BSDs are coupled to corresponding electrical connection points on DUT 106.

If DUT 106 is compliant with the JTAG boundary scan structure, then it will include a test access port ("TAP") controller 122, a test data input ("TDI") node 124, and a test data output ("TDO") node 126. TAP controller 122 is configured to receive the following signals associated with boundary scan test procedures: test mode select ("TMS"); and test clock ("TCK"). As an option, TAP controller 122 may also receive a test reset ("TRST") signal. In practice, TAP controller 122 is a state machine that controls operations associated with boundary scan cells 120 of DUT 106. The TDI and TDO nodes receive the data input and output signals for the boundary scan chain, and the TCK and TMS signals direct the input and output signals between the states of TAP controller 122. In the example embodiment, each I/O pad 119 has an associated boundary scan cell 120 (in practice, an I/O pad may have one or more associated boundary scan cells). Boundary scan cells 120 are coupled together to form a chain beginning at TDI node 124 and ending at TDO node 126.

BSDs 108/110/112 are also configured to support the JTAG boundary scan architecture. In this regard, BSDs 108/110/112 are each configured to accommodate electrical continuity testing of DUT 106, e.g., continuity testing between I/O pins on DUT 106 and I/O pads on BSDs 108/110/112. In the example embodiment, BSDs 108/110/112 share common TMS, TCK, and TRST control signals. Consequently, all of the BSDs operate synchronously on the same instructions.

Load board 104 is arranged such that a number of I/O signals of DUT 106 are directly routed to ATE 102 and such that a number of I/O signals of DUT 106 are indirectly routed to ATE 102 via one or more of BSDs 108/110/112. In this context, an I/O signal is "directly routed" if the respective I/O connection point on DUT 106 has a 1:1 mapping to an I/O test channel of ATE 102. In a practical embodiment, the I/O pin connections are realized as metal traces formed on load board 104 using conventional printed circuit technologies. Indirect routing of I/O test signals enables testing system 100 to accommodate any number of I/O signals, even when the number of I/O signals exceeds the number of ATE test channels. In the example embodiment, four I/O pins of DUT 106 are directly connected to ATE 102 (the directly connected signals are identified by reference number 128), while the remaining twelve I/O pins of DUT 106 are indirectly connected to ATE 102. In FIG. 1, each BSD 108/110/112 is coupled to four I/O pins of DUT 106. In this regard, boundary scan cells corresponding to the indirectly connected pins of DUT 106 are linked to boundary scan cells in the respective BSD.

In a practical embodiment, load board 104 may be configured such that "important" or "critical" I/O pins on DUT 106 are directly connected to ATE 102 (to reduce the likelihood of test errors). In this regard, the directly connected signals 128 in FIG. 1 include: scan in ("SI"); scan out ("SO"); one or more primary inputs ("PI"); and one or more primary outputs ("PO"). The directly connected I/O pins on DUT 106 can be tested using a distinct and separate testing process using conventional features of ATE 102.

Briefly, each boundary scan cell in a device functions as a shift register element associated with the respective I/O pad. In accordance with one practical embodiment, each boundary scan cell in the BSD functions as a bi-directional element capable of providing data to the output pins of the BSD and receiving data applied to the input pins of the BSD. The boundary scan cells in DUT 106 need not be bi-directional in nature, i.e., input pads of DUT 106 may be associated with input cells and output pads of DUT 106 may be associated with output cells, where the input and output cells are differently configured. The boundary scan cells are coupled in a shift register path around the periphery or boundary of the device. The boundary scan architecture facilitates the testing of device inputs and outputs independent of the on-chip device logic core. The operation of TAP controllers and other JTAG boundary scan features of DUT 106 and BSDs 108/110/112 (as governed by IEEE Standard 1149.1) will not be described in detail herein.

FIG. 3 is a schematic representation of a boundary scan cell 300 corresponding to an input pad 302, and FIG. 4 is a schematic representation of a boundary scan cell 400 corresponding to an output pad 402. Cell 300 is configured to receive external data at input pad 302 (in response to an instruction to do so), and to pass that data to the logic core of the device and/or to the next cell via a scan output port 304. Cell 300 also includes a scan input port 306 for receiving test data from a previous cell. Referring to FIG. 4, cell 400 is configured to drive output data onto output pad 402 (in response to an instruction to do so), and to pass such data to the next cell via a scan output port 404. Cell 400 also includes a scan input port 406 for receiving test data from a previous cell.

FIG. 5 is a circuit diagram of a universal boundary scan cell 500 (configured in accordance with prior art designs) that, depending upon its orientation and configuration, can be utilized as an input cell or an output cell. For example, if cell 500 is an input cell, then the DATA IN signal 502 represents externally applied data and the DATA OUT signal 504 represents data that can be directed to the core of the device. On the other hand, if cell 500 is an output cell, then the DATA IN signal 502 represents data that may originate from the core of the device and the DATA OUT signal 504 represents data that will appear on the output pad of the device.

Cell 500 generally includes a multiplexer 506, a flip-flop 508, a flip-flop 510, and a multiplexer 512. Cell 500 functions in response to (or generates) the following data and control signals: DATA IN signal 502, DATA OUT signal 504, a SCAN IN signal 514, a SCAN OUT signal 516, a SHIFT DR signal 518, a CLK DR signal 520, an UPDATE DR signal 522, and a MODE signal 524. As described above, SCAN IN signal 514 represents serial scan/test data obtained from a previous boundary scan cell (or, if cell 500 is the first cell in the boundary scan chain, signal 514 represents a test data input pattern), and SCAN OUT signal 516 represents serial scan/test data that is sent to the next boundary scan cell (or, if cell 500 is the last cell in the boundary scan chain, signal 516 represents a test data output pattern). When a plurality of boundary scan cells are connected in series (as in a practical embodiment), SCAN OUT signal 516 represents a test data output pattern that may be indicative of electrical continuity between boundary scan cells realized in interconnected devices.

MODE signal 524 determines whether cell 500 operates its normal mode or its boundary scan test mode. In this regard, if MODE signal 524 is a logic low, then cell 500 operates in its normal mode such that input data is passed to the core of the device and such that output data from the core of the device is driven to an output pad. Most of the following description relates to the boundary scan test mode.

SHIFT DR signal 518 determines whether cell 500 shifts in scan data (i.e., data corresponding to SCAN IN signal 514) or captures data corresponding to DATA IN signal 502. In this regard, if SHIFT DR signal 518 is a logic high, then flip-flop 508 functions to shift the scan data to the next cell. If SHIFT DR signal 518 is a logic low, however, then flip-flop 508 functions to insert data from DATA IN signal 502 into the shifting chain of scan data. Flip-flop 508 (which may also be referred to as a shift register, a capture register, or a scan register) is configured to sample the incoming data (from either DATA IN signal 502 or SCAN IN signal 514) at the rising edge of CLK DR signal 520, and to make the sampled data available at SCAN OUT signal 516 at the next falling edge of CLK DR signal 520. In this manner, a series of boundary scan cells can function as a serial data shift register.

Flip-flop 510 (which may also be referred to as an update register, a shadow register, or a secondary register) is configured to sample the data output from flip-flop 508 and to make such data available for use as DATA OUT signal 504. This operation is referred to as the "update" operation of cell 500. Flip-flop 510 holds output data stable (assuming that the UPDATE DR signal 522 does not cycle) while scan (or captured) data is sampled and shifted out of flip-flop 508.

Referring back to FIG. 1 and FIG. 2, the TCK (TCKB) signal is utilized as an independent test clock, while the TMS (TMSB) signal dictates when data is actually sampled, captured, and shifted by the boundary scan cells. Thus, the timing of SHIFT DR signal 518, CLK DR signal 520, and UPDATE DR signal 522 are responsive to the TMS (TMSB) signal. Regarding BSDs 108/110/112, all of the respective control signals (SHIFT DR signal 518, CLK DR signal 520, UPDATE DR signal 522, and MODE signal 524) can be utilized as "broadcast" signals by all of the respective boundary scan cells. Consequently, each of the BSD boundary scan cells operate concurrently and in the same functional state under the control of the BSD TAP controllers. Regarding DUT 106, all of the respective control signals can also be utilized as broadcast signals by all of the DUT boundary scan cells. The BSD control signals and the DUT control signals, however, are independent of each other.

In practical embodiments, a bi-directional boundary scan cell can be implemented as a multi-bit arrangement that utilizes the contents of update registers to control whether the cell functions as an input cell or an output cell. For example, FIG. 6 is a circuit diagram of a prior art bi-directional boundary scan cell 600 that may be utilized by BSDs 108/110/112. Although cell 600 employs a three-bit arrangement, alternate configurations and arrangements may be utilized to implement the present invention. For example, the number of data registers in each boundary cell may differ depending upon the particular application, the function of the respective I/O pad, and the specific design utilized by the device manufacturer. Cell 600 uses three bits to set its I/O direction and to provide data to drive its output (if necessary). Consequently, if the BSD chain includes 12 boundary scan cells (e.g., as depicted in FIG. 1), then the initial test pattern will be 36 bits long.

Bi-directional boundary scan cell 600 includes an input branch 602, an output branch 604, and an I/O enable branch 606. Each branch includes a shift/capture multiplexer, a scan register, an update register, and a mode select multiplexer. All of the scan registers are clocked by a common CLK DR signal 608, all of the update registers are clocked by a common UPDATE DR signal 610, all of the shift/capture multiplexers are controlled by a common SHIFT DR signal 612, and all of the mode select multiplexers are controlled by a common MODE signal 614.

Cell 600 is configured such that an I/O pad 616 of the respective device can serve as an input pad or an output pad depending upon the state of cell 600. In this regard, if an I/O enable signal 618 is a logic low, then cell 600 functions as an output cell and output branch 604 drives data onto I/O pad 616. In contrast, if I/O enable signal 618 is a logic high, then cell 600 functions as an input cell and input branch 602 receives data from I/O pad 616. The arrangement of bi-directional cell 600 utilizes three bits (maintained by the three update registers) for the I/O configuration and to provide a logical value to the output driver 620 for possible use as output data. Consequently, a test data input pattern received as a SCAN IN signal 622 is cycled (i.e., shifted) three times, and updated by the three update registers to establish a new test condition at cell 600. If the test data input bit corresponding to I/O enable branch 606 is a "0", then the test data input bit corresponding to input branch 602 is irrelevant (i.e., it represents a "don't care" value) and the test data input bit corresponding to output branch 604 can either be a "0" or a "1" depending upon the desired value at I/O pad 616. If the test data input bit corresponding to I/O enable branch 606 is a "1", then the test data input bits corresponding to input branch 602 and output branch 604 are irrelevant. After the appropriate interconnectivity test (referred to as the EXTEST instruction) is performed for the current test condition, the test data input pattern is advanced by three bits to establish the next test condition.

When bi-directional cell 600 is operating in the EXTEST mode to test the interconnection between cell 600 and a corresponding boundary scan cell of another device, data is manipulated as follows. First, cell 600 is initialized and set as either an input cell or an output cell as described above. If cell 600 is configured as an input cell, then during the capture phase (with SHIFT DR signal 612 set to logic low), the data bit present at I/O pad 616, the data bit representing I/O enable signal 618, and the data bit representing the output signal 624 are loaded into the respective capture registers with the rising edge of CLK DR signal 608. In the context of an interconnect test, the data bit present at I/O pad 616 is the only relevant data captured at this time. If cell 600 is configured as an output cell, then the update register in output branch 604 drives an output data bit onto I/O pad 616, and none of the captured data is relevant for purposes of the interconnect test.

The next phase in the EXTEST mode shifts the previously captured data out of the capture registers and to the next cell in the chain (or out of the boundary scan register chain as the test data output signal). This occurs over three clock cycles with the falling edge of CLK DR signal 608. In addition, SHIFT DR signal 612 is set to logic high to allow test data from the previous cell (or, if cell 600 represents the first cell in the chain, new test data input) to be shifted into the capture registers with the rising edge of CLK DR signal 608. Then, during the update phase, the newly shifted data is transferred from the capture registers to the respective update registers with the falling edge of UPDATE DR signal 610. In this manner, the test data output is serially shifted through the boundary scan chain.

Under the control of one or more software applications, testing system 100 performs electrical connectivity tests on DUT 106 using the boundary scan architecture in DUT 106 and in BSDs 108/110/112. In this regard, system 100 checks the integrity of the electrical connections between the I/O pads of DUT 106 and the I/O pads of the BSDs; consequently, system 100 tests electrical continuity between the I/O pads of DUT 106 and the external conductive pins or solder balls on the DUT package. System 100 utilizes one or more test patterns to control data flow into and out of DUT 106 and BSDs 108/110/112. As used herein, a "test pattern" represents a predefined serial stream or sequence of digital data. In the example embodiment shown in FIG. 1, DUT 106 receives one test pattern via TDI node 124, and BSD 108 receives another test pattern via a TDI node 130. In the example embodiment shown in FIG. 2, DUT 106 receives a first test pattern at TDI node 124, BSD 108 receives a second test pattern at TDI node 130, BSD 110 receives a third test pattern at TDI node 132, and BSD 112 receives a fourth test pattern at a TDI node 134.

Each test pattern may be created to accommodate the testing of the particular DUT, to accommodate the specific boundary cell configuration of the DUT, and/or to accommodate the specific boundary cell configuration of the various BSDs. Any of a number of commercially available software applications can be utilized to design suitable test patterns that are compatible with the JTAG boundary scan architecture of the DUT and the BSDs. After the test patterns are created, they are loaded into the memory of ATE 102 and executed as part of a suitable test program. Briefly, the test patterns set the I/O pads of the BSDs for use as input or output pads and initialize the data at the I/O pads of the BSDs and at the I/O pads of the DUT simultaneously.

Figure 7:
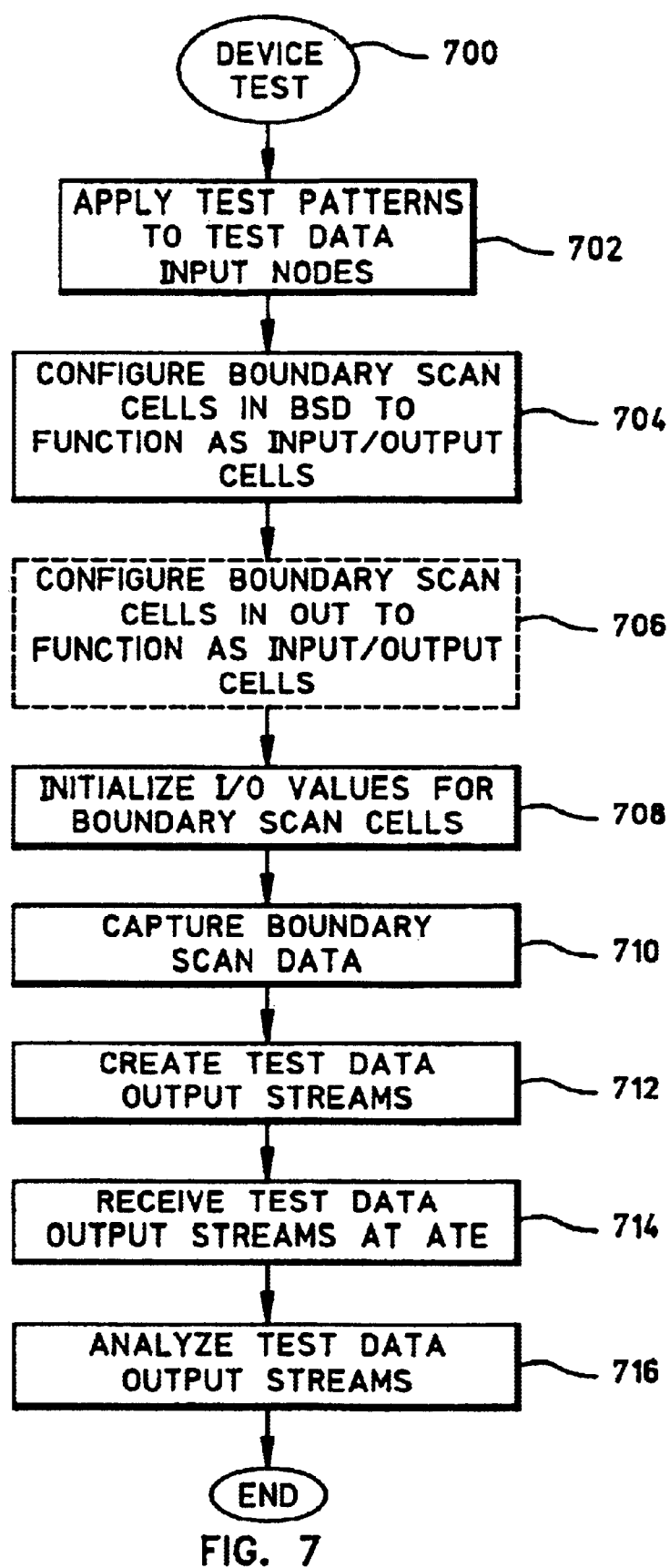
FIG. 7 is a flow diagram of an electronic device test process.

FIG. 7 is a flow diagram of an electronic device test process 700 according to the present invention. The following description of process 700 refers to the system shown in FIG. 1, and assumes that ATE 102 includes test data patterns suitable for the particular DUT 106 and the BSDs utilized by load board 104. In practice, the test data patterns can be stored in a suitable memory element associated with ATE 102. In preparation of testing, the I/O pins of the DUT are suitably connected to boundary scan cells of one or more boundary scan devices. In practice, this preliminary step is accomplished by mounting the DUT onto the load board. In response to the initiation of the test program, ATE 102 retrieves the applicable test data patterns from memory for application to the appropriate test data input nodes (task 702). In the example system shown in FIG. 1, one test data pattern serves as an input to TDI node 124, which corresponds to DUT 106, and another test data pattern serves as an input to TDI node 130, which corresponds to BSD 108. In the example system shown in FIG. 2, one test data pattern serves as an input to TDI node 124, which corresponds to DUT 106, a second test data pattern serves as an input to TDI node 130, which corresponds to BSD 108, a third test data pattern serves as an input to TDI node 132, which corresponds to BSD 110, and a fourth test data pattern serves as an input to TDI node 134, which corresponds to BSD 112. Each test data pattern is designed in conjunction with the other test data pattern (or patterns) for compatibility with the specific DUT 106.

In accordance with one practical embodiment, the test data input patterns are serially shifted through the shift registers in the boundary scan cells until the boundary scan chains are fully initialized. With respect to the example bi-directional BSDs 108/110/112, the first three bits of the test data input pattern is utilized to initialize and configure the last boundary scan cell in BSD 112. In response to the updating of the update registers in the boundary scan cells, test process 700 configures the boundary scan cells in BSDs 108/110/112 such that each boundary scan cell functions as either an input cell or an output cell (task 704). As described previously, the configuration of the cells is responsive to the test data input pattern loaded into the boundary scan shift registers. Alternatively, if BSDs 108/110/112 employ unidirectional boundary scan cells, then task 704 may be omitted. In the example embodiment, each boundary scan cell in BSDs 108/110/112 is configured in response to the test data pattern prior to the actual boundary scan operation.

If DUT 106 includes bi-directional boundary scan cells, then test process 700 can also configure those cells such that each cell functions as either an input cell or an output cell (optional task 706). Task 706 may be performed in response to the test data patterns and/or in response to an initialization routine whereby the boundary scan cells in DUT 106 are configured independent of the test data patterns. In the example embodiments shown in FIG. 1 and FIG. 2 (and for purposes of most practical DUTs), each I/O pad of DUT 106 represents either an input or an output, but not both. Consequently, task 706 need not be performed for the systems shown in FIG. 1 and FIG. 2, and the initial test data input patterns need not include bits utilized for I/O cell configuration.

Next, test process 700 initializes the I/O values for boundary scan cells in BSD 108, BSD 110, BSD 112, and/or DUT 106 (task 708). During task 708, specific logic high and logic low values from appropriate boundary scan registers are made available at the I/O pads of the BSDs 108/110/112 and the DUT 106. Whether a given I/O pad is initialized with a logic high value or a logic low value is dictated by the test data patterns. Furthermore, depending upon the particular application, task 708 may only initialize output pads or input pads.

After the I/O pads are initialized, test process 700 captures the boundary scan data (task 710) by driving the existing data from output cells for application to the corresponding input cells. For example, an output cell of a BSD will drive a "1" or a "0" value across the respective interconnecting link, to an intended I/O pin of the DUT, and to an intended input pad of the DUT. Likewise, an output cell of the DUT will drive a "1" or a "0" value across the respective link, to an intended I/O pad of a BSD, and to an intended input pad of the BSD. As described above in connection with FIG. 5 and FIG. 6, the transferred data (assuming the interconnection is not faulty) is captured and temporarily stored in a boundary scan register associated with the destination boundary scan cell. For example, in FIG. 1, the data in the output cell 136 of BSD 108 is transferred and captured by the input cell 138 of DUT 106. In parallel, the data in the output cell 140 of DUT 106 is transferred and captured by the input cell 142 of BSD 108. In practice, all of the boundary scan cells are controlled to transfer and capture data concurrently in this manner. If the connection from the output boundary scan cell and the corresponding input boundary scan cell is intact, then the input boundary scan cell will capture the data from the output boundary scan cell. If not, the input boundary scan cell may capture the wrong data value or a voltage level that does not represent any logic value.

After the test data has been captured, the test result is shifted out of the boundary scan cell and into the next boundary scan cell. In this manner, the captured test data is utilized to create test data output patterns (task 712) corresponding to BSDs 108/110/112 and corresponding to DIJT 106. In the embodiment shown in FIG. 1, one test data output pattern appears at a TDO node 144 of BSD 112, while another test data output pattern appears at TDO node 126 of DUT 106. These test data output streams are received by ATE 102 and stored for analysis and processing (task 714). Accordingly, the test data output patterns are created in response to the test data input patterns and in response to the integrity of the interconnections between the BSDs and the DUT. After the test data input patterns have been completely clocked through the BSDs and the DUT, the resulting test data output streams can be processed and analyzed by ATE 102 (task 716) to check the integrity of the die-to-pad interconnects of DUT 106. Task 416 can also identify faulty I/O pins of DUT 106 by comparing the received output data patterns to "ideal" output data patterns associated with a good DUT.

In accordance with one practical embodiment in which BSDs 108/110/112 utilize boundary scan cells having three serial scan registers, three test clock cycles are required to shift test data from one I/O pad to the next. Assuming that DUT 106 utilizes boundary scan cells having only one boundary scan register, the boundary scan chain through BSDs 108/110/112 (in FIG. 1) is three times longer than the boundary scan chain through DUT 106. In this regard, the scan operation for DUT 106 includes "wait time" corresponding to the additional time required to perform the boundary scan through BSDs 108/110/112. In contrast, system 200 shown in FIG. 2 can be utilized to reduce the overall test time by establishing a plurality of BSD scan chains. Switch assemblies 114/116 are reconfigured such that each BSD corresponds to a separate scan chain; each chain begins at an assigned TDI node and ends at an assigned TDO node. The interconnections between BSDs 108/110/112 and DUT 106 establish a one-to-one relationship of BSD boundary scan cells to DUT boundary scan cells.

As mentioned above, in operation, system 200 utilizes four test data input patterns and four test data output patterns are generated in the manner described above in connection with system 100. Although each BSD operates independently, all BSDs 108/110/112 perform the boundary scan simultaneously and in response to common control signals (including a common TckB test clock signal). Thus, the overall scan time is reduced because test data is shifted through the individual BSDs simultaneously.

In summary, a device testing system according to the present invention, in conjunction with a test methodology such as test process 700, facilitates the testing of a DUT with an ATE having a limited number of direct I/O testing ports. In the example embodiment, only four I/O pins of DUT 106 are directly tested by ATE 102, while a number of I/O pins of DUT 106 are indirectly tested via the BSDs. Assuming that all of the BSDs are functioning properly, the load board can be used to verify the integrity of the die-to-pin connections on DUT 106 via the BSDs.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An electronic device testing apparatus comprising:
   a device receptacle configured to receive a device under test ("DUT"), said device receptacle comprising a plurality of electrical connections corresponding to input/output pins of said DUT;
   a boundary scan arrangement comprising a number of input/output pads; and
   a number of conductive links, each being connected between one of said input/output pads and one of said electrical connections;
   said boundary scan arrangement being configured to accommodate electrical continuity testing of said DUT.

2. An apparatus according to claim 1, wherein:
   said device receptacle includes a number of electrical connections corresponding to a like number of input/output pins of said DUT;
   a first subset of said number of electrical connections represents one or more direct test channels; and
   a second subset of said number of electrical connections represents one or more indirect test channels corresponding to said boundary scan arrangement.

3. An apparatus according to claim 1, wherein said boundary scan arrangement comprises a test data input node configured to receive a test data input pattern for application to said boundary scan arrangement.

4. An apparatus according to claim 3, further comprising a DUT test data input node configured to receive a DUT test data input pattern for application to said DUT.

5. An apparatus according to claim 1, wherein said boundary scan arrangement is compatible with JTAG boundary scan techniques set forth in IEEE Standard 1149.1.

6. An apparatus according to claim 1, further comprising a test data output node configured to provide a test data output pattern indicative of electrical continuity between input/output pins of said DUT and input/output pads of said boundary scan arrangement.

7. An electronic device testing apparatus comprising:
   a device receptacle configured to receive a device under test ("DUT"), said device receptacle comprising a plurality of electrical connections corresponding to input/output pins of said DUT;
   a first boundary scan arrangement comprising a number of input/output pads;
   a second boundary scan arrangement comprising a number of input/output pads;
   a number of conductive links, each being connected between one of said input/output pads and one of said electrical connections;
   a first test data input node configured to receive a first test data input pattern for application to said first boundary scan arrangement;
   a first test data output node configured to provide a first test data output pattern indicative of electrical continuity between input/output pins of said DUT and input/output pads of said first boundary scan arrangement;
   a second test data input node configured to receive a second test data input pattern for application to said second boundary scan arrangement; and
   a second test data output node configured to provide a second test data output pattern indicative of electrical continuity between input/output pins of said DUT and input/output pads of said second boundary scan arrangement.

8. An apparatus according to claim 7, wherein said first boundary scan arrangement and said second boundary scan arrangement are each compatible with JTAG boundary scan techniques set forth in IEEE Standard 1149.1.

9. An electronic device testing apparatus comprising:
   a device under test ("DUT") comprising a plurality input/output pins;

a boundary scan arrangement comprising a number of input/output pads and a number of boundary scan cells, each of said input/output pads being connected to one of said input/output pins of said DUT, and each of said input/output pads corresponding to one of said boundary scan cells;

a test data input node connected to one of said boundary scan cells, said test data input node being configured to receive a test data input pattern for testing electrical continuity of said DUT; and a test data output node connected to another one of said boundary scan cells, said test data output node being configured to provide a test data output pattern indicative of electrical continuity between said input/output pins of said DUT and said input/output pads of said boundary scan arrangement.

10. An apparatus according to claim 9, wherein each of said input/output pins corresponds to a DUT boundary scan cell, and wherein said apparatus further comprises:

a second test data input node connected to one of said DUT boundary scan cells, said second test data input node being configured to receive a DUT test data input pattern for testing electrical continuity of said DUT; and a second test data output node connected to another one of said DUT boundary scan cells, said second test data output node being configured to provide a second test data output pattern indicative of electrical continuity between said input/output pins of said DUT and said input/output pads of said boundary scan arrangement.

11. An apparatus according to claim 10, wherein said first test data input pattern initializes data at said input/output pins of said DUT.

12. An apparatus according to claim 9, wherein said test data input pattern controls whether said boundary scan cells function as input cells or output cells.

13. An apparatus according to claim 9, wherein said test data input pattern initializes data at said input/output pads of said boundary scan arrangement.

14. An apparatus according to claim 9, wherein said boundary scan arrangement comprises a plurality of boundary scan devices.

15. An apparatus according to claim 14, wherein said plurality of boundary scan devices are connected in series.

16. A method of testing electrical continuity of input/output pins of a device under test ("DUT"), said method comprising:

connecting said input/output pins to boundary scan cells of a boundary scan arrangement;

shifting a test data input pattern into said boundary scan cells;

driving input data from a first subset of said boundary scan cells for application to a first subset of said input/output pins, and output data from a second subset of said input/output pins for application to a second subset of said boundary scan cells; and capturing test data at said boundary scan arrangement and at said DUT in response to said driving step.

17. A method according to claim 16, wherein said test data is indicative of electrical continuity between said input/output pins of said DUT and input/output pads of said boundary scan cells.

18. A method according to claim 16, further comprising configuring each of said boundary scan cells to function as either an input cell or an output cell.

19. A method according to claim 18, wherein said configuring step is responsive to said test data input pattern.

20. A method according to claim 16, further comprising generating a test data output pattern from said test data.

21. A method according to claim 20, further comprising analyzing said test data output pattern to identify faulty input/output pins of said DUT.

* * * * *

UNITED STATES PATENT AND TRADEMARK OFFICE
CERTIFICATE OF CORRECTION

PATENT NO. : 6,862,705 B1
DATED : March 1, 2005
INVENTOR(S) : R.T. Nesbitt et al.

It is certified that error appears in the above-identified patent and that said Letters Patent is hereby corrected as shown below:

Title page,
Item [54], Title, should read -- SYSTEM AND METHOD FOR TESTING HIGH PIN COUNT ELECTRONIC DEVICES USING A TEST BOARD WITH LIMITED TEST CHANNELS --

Signed and Sealed this

Seventeenth Day of May, 2005

JON W. DUDAS
*Director of the United States Patent and Trademark Office*